United States Patent
Tsai

(10) Patent No.: US 7,221,569 B2
(45) Date of Patent: May 22, 2007

(54) MEMORY HEAT-DISSIPATING DEVICE

(75) Inventor: Tung-Bau Tsai, Taipei County (TW)

(73) Assignee: Comptake Technology Co., Ltd., Taipei (TW)

( * ) Notice: Subject to any disclaimer, the term of this patent is extended or adjusted under 35 U.S.C. 154(b) by 174 days.

(21) Appl. No.: 10/940,708

(22) Filed: Sep. 15, 2004

(65) Prior Publication Data

US 2006/0056160 A1    Mar. 16, 2006

(51) Int. Cl.
*H05K 7/20*    (2006.01)
(52) U.S. Cl. ...................... 361/704; 257/719; 361/710; 361/715
(58) Field of Classification Search ........ 257/718–719; 361/710, 715

See application file for complete search history.

(56) References Cited

U.S. PATENT DOCUMENTS 5,109,318 A * 4/1992 Funari et al. ............... 361/710
6,233,150 B1 * 5/2001 Lin et al. .................... 361/704
6,297,966 B1 * 10/2001 Lee et al. .................... 361/799

\* cited by examiner

*Primary Examiner*—Greg Thompson

(57)    ABSTRACT

A memory heat-dissipating device embodying two heat-conducting films, two heatsinks and two clip members, wherein the two heatsinks mutually clip together, and which thereby forms a space between inner side surfaces of the heatsinks that proffers a memory to be disposed and contained therein. Furthermore, the heat-conducting films are separately attached and so configured to an inner side surface of each of two heatsinks. Inverted U-shaped clip brace portions, center of which are open-mouthed, are configured as protrusions on each outer side surface of fins of each of the heatsinks respectively, in addition, an inwardly press-folded anti-dust strip is configured between clip support mounts configured on top edges of two sides of the heatsinks, and which are utilized to prevent dust and impurities from penetrating the heatsinks, thereby influence on effectiveness of the memory and the heatsinks is avoided.

1 Claim, 3 Drawing Sheets

MEMORY HEAT-DISSIPATING DEVICE

BACKGROUND OF THE INVENTION (a) Field of the Invention

The present invention relates to a memory heat-dissipating device, and more particularly to an advancement in heat dissipation effectiveness of heatsinks, which thereby enhances economic effectiveness and practicability of the memory heat-dissipating device.

(b) Description of the Prior Art

A conventional memory heat-dissipating device 1, as depicted in FIG. 1, is constructed to comprise two heat-conducting plastic sheets 11, two heatsinks 12 and 2 clip members 13. Wherein the heat-conducting plastic sheets 11 are separately attached to an inner side surface of each of the heatsinks 12. A clasp fastener hook 121, a clasp fastener hole 122 and a clip support mount 123 are separately configured on each of two sides of top edges of the heatsinks 12, therewith enabling the two heatsinks 12 to mutually clip fasten together. A space is thus formed between the inner side surfaces of the heatsinks 12 that proffers a memory 10 to be disposed and contained therein. A positioning piece 124 is press-folded downward and configured center of each of the clip support mounts 123, and each of the positioning pieces 124 appropriately corresponds to a limiting slot 125 having a U-shaped protruding form and configured on a lower section of an outer side surface of each of the heatsinks 12. A clasp hole 126 is defined above each of the limiting slots 125. A guide-positioning hole 127 is defined above each of the clasp holes 126, and which provides for each of the inverted U-shaped clip members 13 to separately astride each of the positioning pieces 124. Furthermore, barbs 131 separately configured on each of two inner sides of each of the inverted U-shaped clip members 13 are oriented by means of the guide positioning hole 127 to slide into the clasp hole 126 and are thus accommodated therein, accordingly, the barbs 131 are insertedly disposed into the clasp holes 126 and a reverse clasp fastening is effectuated by means of the barbs 131 thereof. The two heatsinks 12 and the memory 10 are thus assembled to form a compact encasement, which enables heat produced by the memory 10 while operating to be rapidly and uniformly conducted to the heatsinks 12 and dissipated therefrom.

According to the aforementioned configuration, after assembling the conventional memory heat-dissipating device 1, although the memory heat-dissipating device 1 is able to achieve effectiveness of heat dissipation, the following shortcomings are still evident:

1. In order to enable the two heatsinks 12 and the memory 10 to form a compact encasement, the limiting slots 125 each formed from the U-shaped surface protrusions, the clasp holes 126 and the guide positioning holes 127 are configured on the outer side surfaces 122 of the heatsinks 12 of the conventional memory heat-dissipating device 1, and necessarily configured so as to function in coordination with configuration of the barbs 131 of the inverted U-shaped clip member 13. Hence, manufacturing process of such a configuration as adopted for the conventional memory heat-dissipating device 1 is time-consuming and work intensive, which results in reduction in economic effectiveness 2. Because the configuration as adopted for the conventional memory heat-dissipating device 1 is not provided with dust resistant functionality, upon assembling the heatsinks 12 and the memory 10, a number of gaps form along a top edge of the memory heat-dissipating device 1, which easily allow dust and impurities to penetrate the heatsinks 12, thereby influencing effectiveness of the memory 10 and the heatsinks 12.

Accordingly, in light of the aforementioned, the inventor of the present invention, applying theoretical knowledge acquired and accumulated years of practical experience in related art, has actively made a study on improving design of the memory heat-dissipating device, and after repeated trials ultimately developed an improved structure for the memory heat-dissipating device that is both practical and provided with a more extensive range of application, moreover, the present invention conforms to industrial utility value.

SUMMARY OF THE INVENTION

The present invention is primarily structured to comprise two heat-conducting films, two heatsinks and two clip members. Wherein the two heatsinks mutually clip together, which thereby forms a space between inner side surfaces of the heatsinks that proffers a memory to be disposed and contained therein. Furthermore, the heat-conducting films are separately attached and so configured to an inner side surface of each of two heatsinks. Inverted U-shaped clip brace portions, center of which are open-mouthed, are configured as protrusions on each outer side surface which act as fins of each of the heatsinks respectively, and appropriately positioned below positioning pieces configured on a top edge of the heatsinks. Each of the clip members assume an inverted U-shaped form, and an arrow-shaped portion is configured on a lower end of each of two sides of each clip member. Upon the inverted U-shaped clip members being pressed down to astride each of the positioning pieces, the arrow-shaped portions appropriately provide for bracing the clip brace portions of the heatsinks, thereby enabling the clip members to clip fasten together the heatsinks. In addition, an inwardly press-folded anti-dust strip is configured between clip support mounts configured on top edges of two sides of the heatsinks, and which are utilized to prevent dust and impurities from penetrating the heatsinks, thereby influence on effectiveness of the memory 20 and the heatsinks 22 is avoided.

A primary objective of the present invention is to provide a configuration that employs the inverted U-shaped clip brace portions configured as protrusions on the outer side surfaces of the fins of each of the heatsinks to function in coordination with the configuration that adopts the arrow-shaped portions of the inverted U-shaped clip members, which thereby simplifies manufacturing process of the memory heat-dissipating device, and moreover, provides for the two heatsinks and the memory to form a compact encasement when assembled, and which achieves heat-dissipating effect and advancement in economic benefit of the memory heat-dissipating device.

A second objective of the present invention is to provide a configuration whereby the aforementioned anti-dust strips effectuate preventing dust and impurities from penetrating the heatsinks, thereby influence on effectiveness of the memory and the heatsinks is avoided and realizes normal operation of the memory heat-dissipating device.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
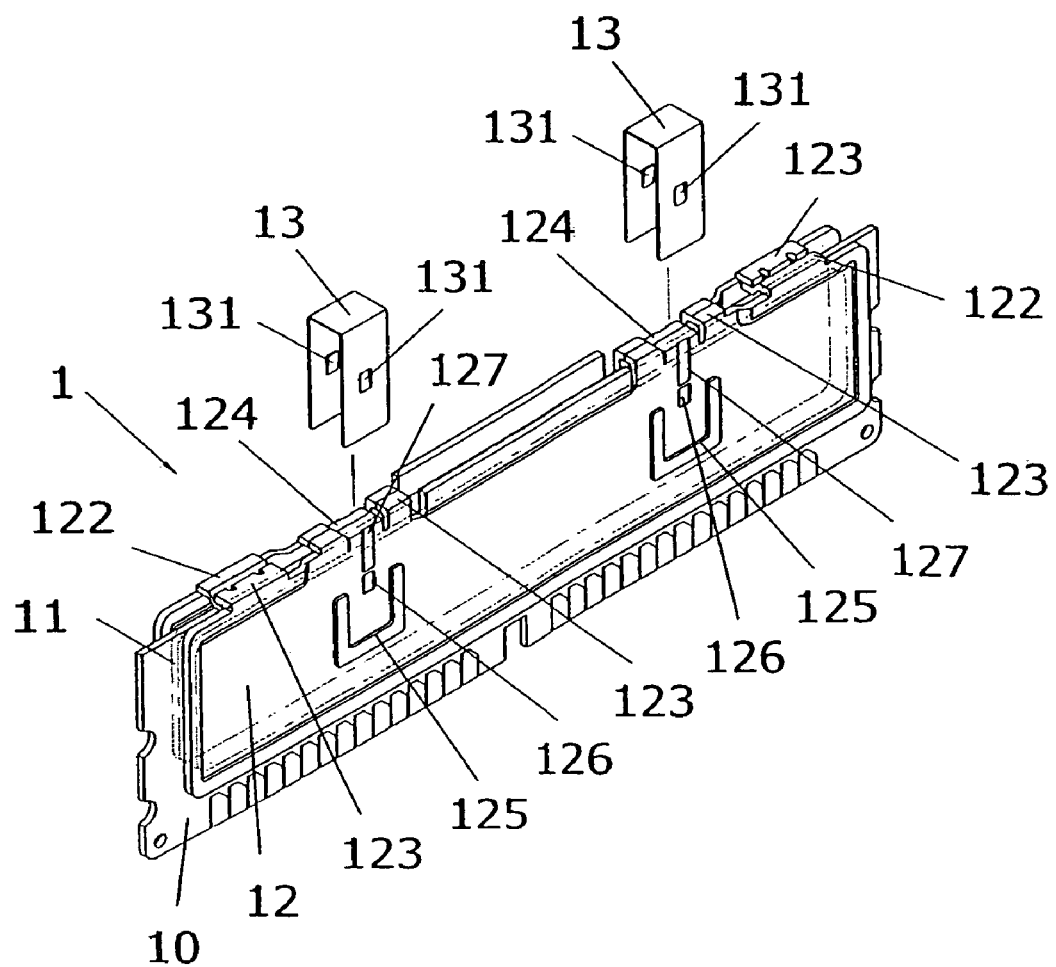
FIG. 1 shows an assembled elevational schematic view of a conventional memory heat-dissipating device.
Figure 2:
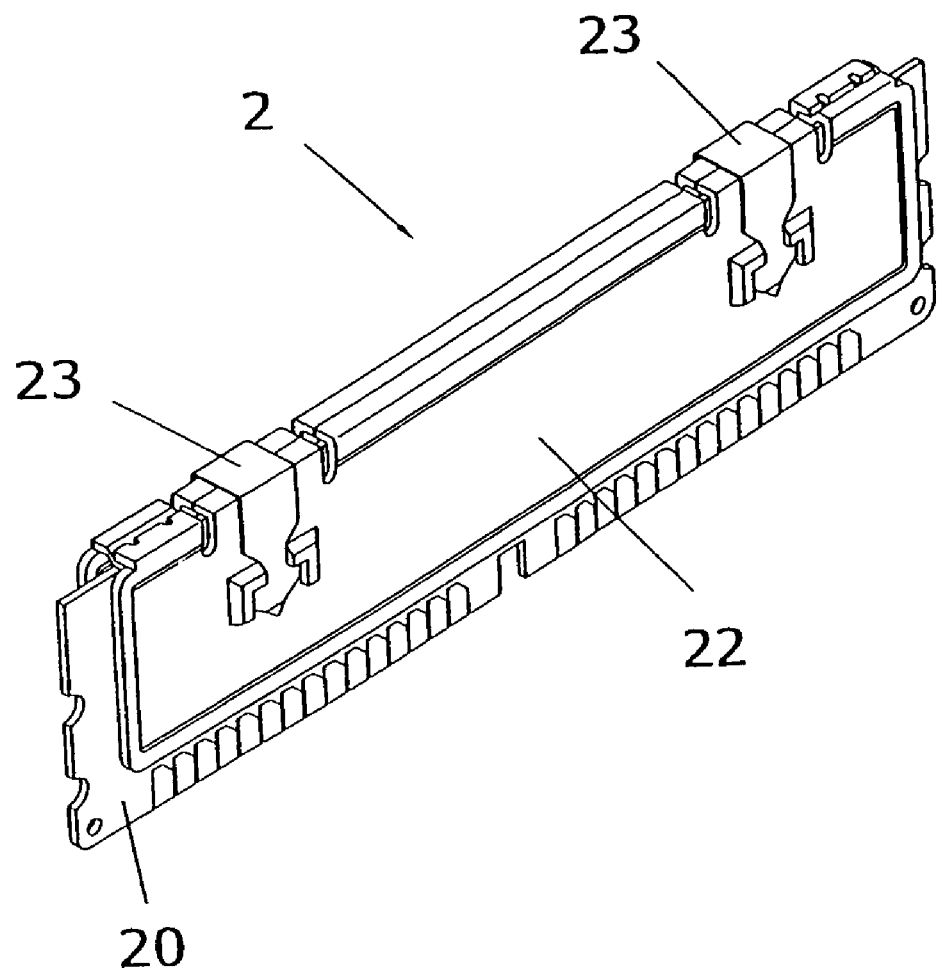
FIG. 2 shows an assembled elevational schematic view according to the present invention.
Figure 3:
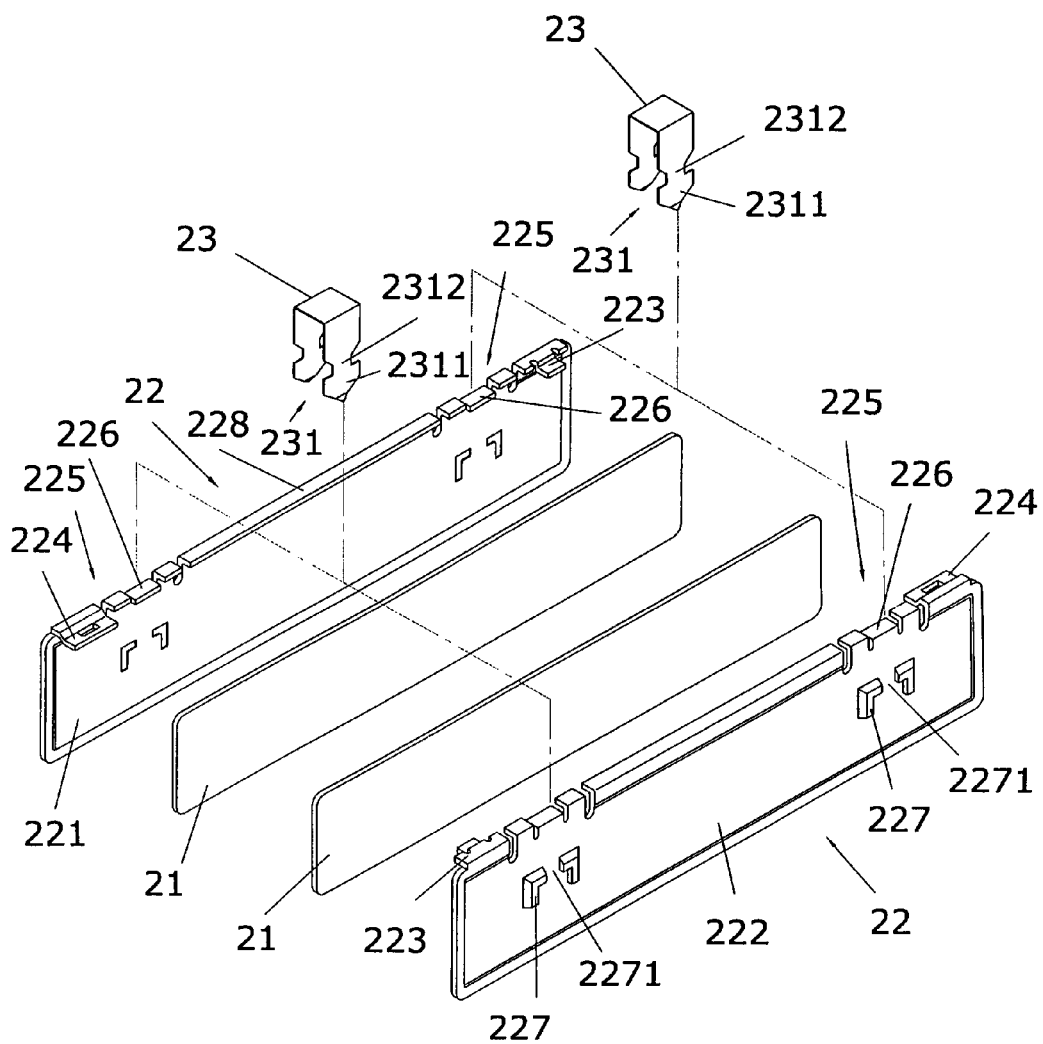
FIG. 3 shows an exploded elevational schematic view according to the present invention.

Referring to FIGS. 2 and 3, which show an assembled and an exploded elevational view respectively according to the present invention. A memory heat-dissipating device 2 of the present invention comprises two heat-conducting films 21 separately attached and so configured to inner side surfaces 221 of each of two heatsinks 22 respectively. A clip support mount 225, a clasp hook 223 and a clasp hole 224 are separately configured on two sides of top edges of the two heatsinks 22. A space is thus formed between the inner side surfaces 221 of the heatsinks 22 that proffers a memory 20 to be disposed and contained therein. A positioning piece 226 is press-folded downward and configured center of each of the clip support mounts 225, and which provide for each of the clip members 23 to separately astride each of the positioning pieces 226, and thereby clip fasten together the two heatsinks 22, and thus enables heat produced by the memory 20 while operating to be rapidly and uniformly conducted to the heatsinks 12 and dissipated therefrom. Characteristics of the preset invention are as described hereinafter:

Inverted U-shaped clip brace portions 227, center of which are open-mouthed, are configured as protrusions on outer side surfaces 222 which act as fins of each of the heatsinks 22 respectively, and appropriately positioned below the positioning pieces 226. Each of the clip members 23 assume an inverted U-shaped form, and an arrow-shaped portion 231 is configured on a lower end of each of two sides of each of the clip members 23. Upon the inverted U-shaped clip member 23 being pressed down to astride each of the positioning pieces 226, the arrow-shaped portions 231 appropriately provide for bracing the clip brace portions 227 of the heatsinks 22, thereby enabling the clip members 23 to clip fasten together the heatsinks 22. Furthermore, an inwardly press-folded anti-dust strip 228 is configured between each of the clip support mounts 225 configured on top edges of two sides of the heatsinks 22, and which are utilized to prevent dust and impurities from penetrating the heatsinks 22, thereby influence on effectiveness of the memory 20 and the heatsinks 22 is avoided.

According to the aforementioned configuration, when assembling the memory heat-dissipating device 2 of the present invention, first the two heat-conducting films 21 are separately attached to the inner side surfaces 221 of the two heatsinks 22, the clasp hook 223 and the clasp hole 224 configured on the two sides on the top edge of the heatsinks 22 are mutually clasped together thereafter, thereby enabling the clip support mounts 225 and the anti-dust strips 228 co-configured on the top edge of the heatsinks 22 to form a closing, whereupon the memory 20 is insertedly disposed in a containment space formed from mutual clipping together of the heatsinks 22. Thereupon, each of the inverted U-shaped clip members 23 are positioned so as to astride each of the positioning pieces 226 configured between the clip support mounts 225 and pressed down thereon, thereby enabling an arrow head 2311 of the arrow-shaped portion 231 configured on the lower end of each of the two sides of each of the clip members 23 to brace and thereby fasten within the inverted U-shaped clip brace portion 227 configured as protrusions on the outer side surfaces 221 of the fins of each of the heatsinks 22 respectively, whereupon an arrow head 2312 of each of the arrow-shaped portions 231 are appropriately inserted and thereby disposed within each open mouth 2271 defined between center of the inverted U-shaped clip brace portions 227.

In realizing the aforementioned configuration, the present invention configured employs the inverted U-shaped clip brace portions 227, center of which are open-mouthed, and configured as protrusions on the outer side surfaces 222 of the fins of each of the heatsinks 22 to function in coordination with the arrow-shaped portion 231 of the inverted U-shaped clip members 23, and thereby simplifies manufacturing process of the memory heat-dissipating device 2, and moreover, enables heat produced by the memory 20 while operating to be rapidly and uniformly conducted to the heatsinks 12 and dissipated therefrom. Furthermore, the aforementioned anti-dust strips 228 effectuate preventing dust and impurities from penetrating the heatsinks 22, and thereby enhances effectiveness of the memory 20 and the heatsinks 22, thus advancing economic benefit of the memory heat-dissipating device 2 of the present invention.

In conclusion, improved structure of the memory heat-dissipating device of the present invention clearly better provides practicability and economic value compared to structure of the conventional memory heat-dissipating device, moreover, the present invention assuredly extends innovation and effectiveness of advancement. Furthermore, contents of the present invention have not been publicly disclosed prior to this application, and advancement and practicability of the present invention comply with essential elements as required for application of a new patent model. Accordingly, a patent application is proposed herein.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A memory heat-dissipating device comprising two heat-conducting films separately attached and so configured to inner side surfaces of each of two heatsinks respectively; a clip support mount, a clasp hook and a clasp hole are separately configured on two sides of top edges of the two heatsinks, which enable clipping together of the two heatsinks therewith, thereby forming a space between the inner side surfaces of the heatsinks that proffers a memory to be disposed and contained therein; a positioning piece is press-folded downward and configured center of each of the clip support mounts, and which provide for clip members to separately astride each of the positioning pieces, thereby clip fastening together the two heatsinks, thus heat produced by the memory while operating is rapidly and uniformly conducted to the heatsinks and dissipated therefrom; and characterized in that:

inverted U-shaped clip brace portions, center of which are open-mouthed, are configured as protrusions on outer side surfaces which act as fins of each of the heatsinks, and appropriately positioned below the positioning pieces; each of the clip members assume an inverted U-shaped form, and an arrow-shaped portion is configured on a lower end of each of two sides of each of the clip members; upon the inverted U-shaped clip members being pressed down to astride each of the positioning pieces, the arrow-shaped portions appropriately provide for bracing the clip brace portions of the heatsinks, thereby enabling the clip members to clip fasten together the heatsinks; in addition, an inwardly press-folded anti-dust strip is configured between each of the clip support mounts configured on top edges of two sides of the heatsinks, and which are utilized to prevent dust and impurities from penetrating the heatsinks, thereby influence on effectiveness of the memory and the heatsinks is avoided.

* * * * *